(12) United States Patent
Macelwee

(10) Patent No.: US 10,985,259 B2
(45) Date of Patent: Apr. 20, 2021

(54) GAN HEMT DEVICE STRUCTURE AND METHOD OF FABRICATION

(71) Applicant: GaN Systems Inc., Ottawa (CA)

(72) Inventor: Thomas Macelwee, Nepean (CA)

(73) Assignee: GaN Systems Inc., Ottawa (CA)

( * ) Notice: Subject to any disclaimer, the term of this patent is extended or adjusted under 35 U.S.C. 154(b) by 0 days.

(21) Appl. No.: 16/212,755

(22) Filed: Dec. 7, 2018

(65) Prior Publication Data

US 2020/0185508 A1   Jun. 11, 2020

(51) Int. Cl.
*H01L 29/66* (2006.01)
*H01L 29/778* (2006.01)
*H01L 29/20* (2006.01)
*H01L 29/205* (2006.01)
*H01L 21/02* (2006.01)
*H01L 21/308* (2006.01)

(52) U.S. Cl.
CPC .... *H01L 29/66462* (2013.01); *H01L 21/0254* (2013.01); *H01L 21/02579* (2013.01); *H01L 21/02595* (2013.01); *H01L 21/02636* (2013.01); *H01L 21/308* (2013.01); *H01L 29/2003* (2013.01); *H01L 29/205* (2013.01); *H01L 29/778* (2013.01)

(58) Field of Classification Search
CPC .......... H01L 29/4232; H01L 29/7786
See application file for complete search history.

(56) References Cited

U.S. PATENT DOCUMENTS

2010/0219395 A1* 9/2010 Hirayama ............... H01L 33/06
                                                      257/13
2010/0244018 A1* 9/2010 Kaneko ............... H01L 29/4323
                                                      257/43
(Continued)

OTHER PUBLICATIONS

Cooke, Digital etch recess achieves highest current for e-mode GaN MISHFET on silicon,Sep. 2013, Semiconductor Today, vol. 8 Issue 7, pp. 86 and 87. (Year: 2013).*
(Continued)

*Primary Examiner* — Fernando L Toledo
*Assistant Examiner* — Valerie N Newton
(74) *Attorney, Agent, or Firm* — Miltons IP/p.i.

(57) ABSTRACT

GaN HEMT device structures and methods of fabrication are provided. A masking layer forms a p-dopant diffusion barrier and selective growth of p-GaN in the gate region, using low temperature processing, reduces deleterious effects of out-diffusion of p-dopant into the 2DEG channel. A structured $Al_xGa_{1-x}N$ barrier layer includes a first thickness having a first Al %, and a second thickness having a second Al %, greater than the first Al %. At least part of the second thickness of the $Al_xGa_{1-x}N$ barrier layer in the gate region is removed, before selective growth of p-GaN in the gate region. The first Al % and first thickness are selected to determine the threshold voltage Vth and the second Al % and second thickness are selected to determine the Rdson and dynamic Rdson of the GaN HEMT, so that each may be separately determined to improve device performance, and provide a smaller input FOM (Figure of Merit).

25 Claims, 8 Drawing Sheets

(56) References Cited

U.S. PATENT DOCUMENTS

| | | | |
|---|---|---|---|
| 2013/0082274 A1* | 4/2013 | Yang | H01L 33/12 |
| | | | 257/76 |
| 2013/0153923 A1 | 6/2013 | Decoutere | |
| 2013/0292699 A1* | 11/2013 | Ueno | H01L 29/778 |
| | | | 257/76 |
| 2014/0183448 A1* | 7/2014 | Krishnamoorthy | |
| | | | H01L 33/0095 |
| | | | 257/13 |
| 2016/0240645 A1* | 8/2016 | Prechtl | H01L 23/3171 |
| 2017/0179272 A1 | 6/2017 | You et al. | |
| 2017/0263700 A1* | 9/2017 | Stoffels | H01L 21/2258 |
| 2019/0140134 A1* | 5/2019 | Mann | H01L 33/14 |

OTHER PUBLICATIONS

Heikman et al, Digital Etching for Highly Reproducible Low Damage Gate Recessing on ALGaN/GaN HEMTs, 2002, IEEE, vol. 7, pp. 461-469. (Year: 2002).*

N. E. Posthuma et al., "Impact of Mg out-diffusion and activation on the p-GaN gate HEMT device performance", Proceedings of the 2016 28th International Symposium on Power Semiconductor Devices and ICs (ISPSD) Jun. 12-16, 2016, Prague, Czech Republic.

* cited by examiner

GAN HEMT DEVICE STRUCTURE AND METHOD OF FABRICATION

CROSS-REFERENCE TO RELATED APPLICATION(S)

n/a

TECHNICAL FIELD

This invention relates to device structures comprising GaN High Electron Mobility Transistors (HEMTs) and methods of fabrication.

BACKGROUND

Conventional methods of fabrication of GaN HEMTs on silicon substrates typically comprise high temperature MOCVD processes for growth of an epitaxial layer stack comprising a nucleation layer, buffer layers, and a GaN hetero-structure comprising a layer of GaN and an overlying AlGaN barrier layer, to form a 2DEG channel region. One or more conductive metal layers are then deposited and patterned to define source, drain and gate electrodes. For an enhancement mode GaN HEMT, the gate comprises a p-doped GaN layer, e.g. Mg doped p-GaN, under the gate metal. In conventional processes, this p-doped GaN layer is blanket deposited over the GaN/AlGaN layers as part of the epitaxial layer stack. The blanket GaN layer is then masked and etched to leave the p-GaN layer only in the gate region. MOCVD growth temperatures are typically in the range from 1000 C to 1100 C. This means that during blanket growth of the p-GaN layer, the p-dopant can out-diffuse and migrate into the underlying 2DEG channel region. The presence of p-type dopants in the channel region will act as acceptors and compensate or reduce the density of the 2DEG channel charge. This out-diffusion and migration of p-dopant results in an increase in on-resistance Ron and dynamic Rdson (drain-source on-resistance) of the GaN HEMT. It is known that increasing the aluminium content of the $Al_xGa_{1-x}N$ barrier layer and increasing the thickness of the barrier layer will reduce Rdson, however this also tends to reduce the threshold voltage Vth to zero, causing depletion mode operation.

Other issues resulting from conventional processes are difficulty in selectively etching the blanket layer of p-GaN relative to the underlying AlGaN barrier layer, and resulting etch damage to underlying layers of the epitaxial layer stack caused by etching to remove the blanket p-GaN layer, leaving the p-GaN layer only in the gate region. For example, to address these issues, other methods of fabricating enhancement mode GaN HEMTs have been proposed in United States patent publication no. US2013/0153923 entitled "Enhancement Mode III-Nitride Device and Method for Manufacturing Thereof" (Decoutere) and United States patent publication no. US2017/0179272 entitled "Method of Fabricating an Enhancement Mode Group III-Nitride HEMT device and a group III-Nitride Structure Fabricated Therefrom" (You et al.), comprising providing a capping layer before forming the p-GaN layer in a recessed gate structure.

There is a need for improved or alternative GaN HEMT device structures and methods of fabrication for improved device performance, and particularly for improved control of Ron, Rdson and Vth during fabrication of E-mode GaN HEMTs.

SUMMARY OF INVENTION

The present invention seeks to provide GaN HEMT device structures and methods of fabrication that which mitigate or circumvent one or more of the above-mentioned problems, or at least provides an alternative.

A first aspect of the invention provides a method of fabrication of a GaN HEMT comprising:

providing a substrate;

growing an epitaxial layer stack on the substrate, the epitaxial layer stack comprising a buffer layer and a GaN heterostructure comprising a GaN layer and an overlying $Al_xGa_{1-x}N$ barrier layer to form a 2DEG channel region;

providing a masking layer over the epitaxial layer stack and patterning the masking layer to define an opening exposing a gate region of the $Al_xGa_{1-x}N$ barrier layer;

selectively providing p-doped GaN on the gate region;

defining openings through the masking layer to source and drain regions and providing source and drain electrodes thereon, and providing a gate electrode on the p-GaN gate region.

Providing a masking layer comprises deposition of a dielectric passivation layer, the dielectric passivation layer having a thickness and composition that forms a p-dopant diffusion barrier. The passivation layer is etched to provide an opening exposing the gate region on the underlying $Al_xGa_{1-x}N$ barrier layer, which is cleaned to allow for selective growth of p-GaN. Beneficially, to reduce out-diffusion of p-dopant into the 2DEG channel region, the selective area growth of p-GaN is a lower temperature process, e.g. carried out at a temperature below 950 C. For example, the p-GaN layer may be selectively grown in the gate region, or a p-GaN layer is grown in the gate region and may extend over the passivation layer. Any polycrystalline p-GaN which forms over the passivation layer is then removed by etching to leave a p-GaN mesa only in the gate region. The dielectric passivation layer around the gate region comprises one or more layers of a material that acts as a p-dopant diffusion barrier between p-GaN and the underlying $Al_xGa_{1-x}N$ barrier layer.

The dielectric passivation layer may comprise, e.g., one or more layers of a layer of oxide or nitride, such as silicon dioxide or silicon nitride, or other dielectric materials that act as a p-dopant diffusion barrier. For example, the dielectric passivation layer comprises at least one of a layer of dielectric oxide and a layer of dielectric nitride. In an embodiment, patterning the masking layer comprises etching said gate opening to expose the gate region of the $Al_xGa_{1-x}N$ barrier layer, and may comprise further etching the $Al_xGa_{1-x}N$ barrier layer within the gate opening to thin the $Al_xGa_{1-x}N$ barrier layer in the gate region, before selective area growth of p-GaN on the gate region, preferably using low temperature growth of p-GaN carried out at a temperature below 950 C. Patterning the masking layer to expose the gate region of the $Al_xGa_{1-x}N$ barrier layer may comprise providing a gate opening shape that facilitates selective area growth of p-GaN in the gate opening to reduce any gap within the gate opening between the p-GaN in the gate opening and the masking layer. The method may comprise a step of cleaning an exposed surface of the $Al_xGa_{1-x}N$ barrier layer in the gate opening before selective growth of p-GaN on the gate region.

A second aspect of the invention provides a GaN HEMT device structure formed by this method, comprising:

a substrate;

an epitaxial layer stack grown on the substrate, the epitaxial layer stack comprising a buffer layer and a GaN heterostructure comprising a GaN layer and an overlying $Al_xGa_{1-x}N$ barrier layer to form a 2DEG channel region;
a passivation layer formed on the $Al_xGa_{1-x}N$ barrier layer having a gate opening defined on a gate region of the $Al_xGa_{1-x}N$ barrier layer, and source and drain openings defined on source and drain regions of the $Al_xGa_{1-x}N$ barrier layer;
a mesa of p-doped GaN on the gate region;
source and drain electrodes formed on the source and drain regions and a gate electrode formed on the p-doped GaN mesa;
and wherein the $Al_xGa_{1-x}N$ barrier layer comprises a first thickness in the gate region and a second thickness in access regions extending between the gate region and the source region and between the gate region and the drain region; and the first thickness providing a specified threshold voltage and the second thickness providing a specified Rdson of the GaN HEMT device structure.

The the passivation layer comprises at least a first layer of a dielectric material that forms a p-dopant diffusion barrier, for example the first layer of the dielectric material comprises at least one of a layer of dielectric oxide and a layer of a dielectric nitride. Where the p-dopant is magnesium (Mg), said first layer of dielectric material is a Mg diffusion barrier. Thus, for example, an out-diffused p-dopant content in the access regions of the $Al_xGa_{1-x}N$ barrier layer is less than an out-diffused p-dopant content in the gate region of the $Al_xGa_{1-x}N$ barrier layer.

A third aspect of the invention provides a method of fabrication of a GaN HEMT comprising:
providing a substrate;
growing an epitaxial layer stack on the substrate, the epitaxial layer stack comprising a buffer layer and a GaN heterostructure comprising a GaN layer and an overlying $Al_xGa_{1-x}N$ barrier layer to form a 2DEG channel region, wherein the $Al_xGa_{1-x}N$ barrier layer comprises a first thickness having a first Al %, and a second thickness having a second Al %, greater than the first Al %;
providing a masking layer over the epitaxial layer stack and patterning the masking layer to form an opening exposing a gate region of the $Al_xGa_{1-x}N$ barrier layer;
selectively removing at least part of the second thickness of the $Al_xGa_{1-x}N$ barrier layer within the opening;
selectively providing p-GaN on the $Al_xGa_{1-x}N$ barrier layer within the opening to form a p-GaN gate region;
defining openings through the masking layer to source and drain regions and defining source and drain electrodes thereon, and defining a gate electrode on the p-GaN gate region.

The first Al % and the first thickness of the $Al_xGa_{1-x}N$ barrier layer are selected to provide a specified threshold voltage for E-mode operation, e.g. 1.3V to 1.6V or more, and the second Al % and the second thickness of the $Al_xGa_{1-x}N$ barrier layer are selected to provide a specified Rdson and dynamic Rdson of the GaN HEMT. For example, the first Al % is in the range from 15% to 18% and the first thickness of the $Al_xGa_{1-x}N$ barrier layer in the range 15 nm to 20 nm to define a specified threshold voltage for E-mode operation, and the second Al % is in the range from 20% to 25% and the second thickness of the $Al_xGa_{1-x}N$ barrier layer is in the range from 5 nm to 10 nm to provide a specified Rdson and dynamic Rdson of the GaN HEMT. For example, the first Al % and the first thickness of the $Al_xGa_{1-x}N$ barrier layer provides a specified threshold voltage for E-mode operation, e.g. at least 1.3V, and preferably at least 1.6V.

This method of fabrication using selective area gate deposition, and a barrier layer with a structured aluminium percentage (Al %) profile, provides for fabrication of a GaN HEMT with decoupling of the threshold voltage Vth from the source gate resistance Rsg and gate drain resistance Rgd, so that each may be separately determined to improve device performance, and provide a smaller input FOM (Figure of Merit).

Accordingly, a fourth aspect of the invention provides a GaN HEMT device structure fabricated by this method, comprising:
a substrate;
an epitaxial layer stack grown on the substrate, the epitaxial layer stack comprising a buffer layer and a GaN heterostructure comprising a GaN layer and an overlying $Al_xGa_{1-x}N$ barrier layer to form a 2DEG channel region;
a passivation layer formed on the $Al_xGa_{1-x}N$ barrier layer having a gate opening defined on a gate region of the $Al_xGa_{1-x}N$ barrier layer, and source and drain openings defined on source and drain regions $Al_xGa_{1-x}N$ barrier layer;
a mesa of p-doped GaN on the gate region;
source and drain electrodes formed on source and drain regions, and a gate electrode formed on the p-doped GaN mesa; and
wherein the $Al_xGa_{1-x}N$ barrier layer comprises a first thickness having a first Al %, and a second thickness having a second Al %, greater than the first Al %, and wherein at least the second thickness is removed from the gate region whereby the p-doped GaN mesa and the gate electrode are provided a remaining part of the first thickness.

The percentage of aluminum, i.e. the fraction x of aluminum in the $Al_xGa_{1-x}N$ barrier layer, may be increased to increase the 2DEG channel charge in access regions, i.e. in the between the gate and the drain Lgd and between the gate and the source Lgs. For example, in one embodiment, the $Al_xGa_{1-x}N$ barrier layer comprises a first thickness having a lower Al %, e.g. 15% and a second thickness having a higher Al %, e.g. 20%. Since the threshold voltage is determined by the Al % under the gate, in forming the gate, the second thickness of the barrier layer having the higher Al % is removed before selective growth of the p-GaN gate mesa on the first thickness having a lower Al %, to provide a specified threshold voltage, e.g. 1.3 to 1.6V, or more. In the access regions, the higher Al % provides increased 2DEG charge, reducing the Rsg and Rgd, thereby reducing the Ron and dynamic Rdson of the GaN HEMT.

Beneficially, the first Al % of the first thickness of the $Al_xGa_{1-x}N$ barrier layer is selected to provide a specified threshold voltage for reliable E-mode operation, e.g. 1.3V to 1.6V or more, and the second Al % of the second thickness of the $Al_xGa_{1-x}N$ barrier layer to provide a specified Rdson and dynamic Rdson of the GaN HEMT.

For example, the first Al % is in the range from 15% to 18% and the first thickness of the $Al_xGa_{1-x}N$ barrier layer is in the range 15 nm to 20 nm to provide a specified threshold voltage for E-mode operation, and the second Al % is in the range from 20% to 25% and the second thickness of the $Al_xGa_{1-x}N$ barrier layer is in the range from 5 nm to 10 nm to provide a specified Rdson and dynamic Rdson of the GaN HEMT.

To block p-dopant diffusion into the $Al_xGa_{1-x}N$ barrier layer, the passivation layer comprises at least a first layer of a dielectric material that forms a p-dopant diffusion barrier, formed before selective growth of p-GaN. For example, the first layer comprises at least one of a layer of dielectric oxide and a layer of a dielectric nitride. Where the p-dopant is magnesium (Mg), the first layer is a Mg diffusion barrier, to block out-diffusion of magnesium into the access regions of the $Al_xGa_{1-x}N$ barrier layer and avoid deleterious effects on the 2DEG channel charge. Selective growth of p-GaN is the gate region preferably comprises low temperature growth, e.g. at a temperature below 950 C to reduce out-diffusion of Mg into the $Al_xGa_{1-x}N$ barrier layer of the gate region.

The resulting device structures and methods of fabrication provide at least one of: reduced out-diffusion of p-dopants into the 2DEG channel, and structuring of the $Al_xGa_{1-x}N$ barrier layer for more independent control of the threshold voltage, and Ron and dynamic Rdson.

Thus, embodiments of the invention provide GaN HEMT device structures and methods of fabrication for improved device performance.

The foregoing and other objects, features, aspects and advantages of the present invention will become more apparent from the following detailed description, taken in conjunction with the accompanying drawings, of preferred embodiments of the invention, which description is by way of example only.

DETAILED DESCRIPTION

Figure 1:
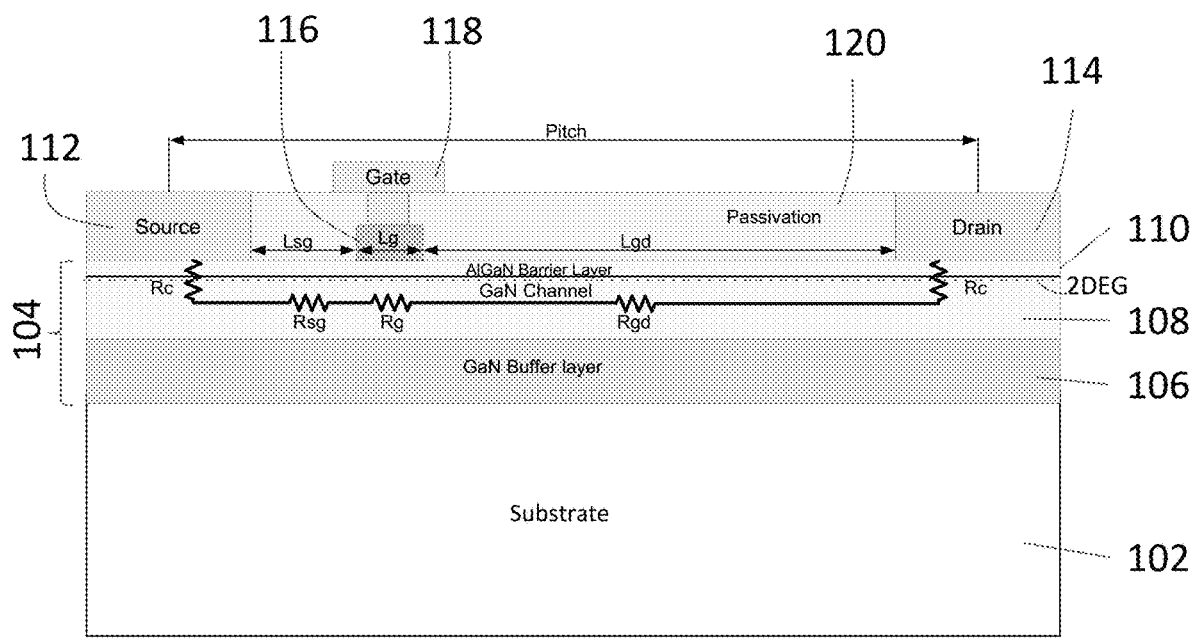
FIG. 1 (Prior Art) shows a schematic cross-sectional view of a conventional E-mode GaN HEMT device structure.

FIG. 1 (Prior Art) shows a simplified schematic cross-sectional view of elements of a conventional E-mode GaN HEMT 100 comprising a substrate 102, e.g. a silicon substrate on which is formed an epitaxial layer stack 104 comprising a nucleation layer, one or more buffer layers 106, and a GaN heterostructure comprising a layer of GaN 108 and an overlying barrier layer of AlGaN 110 which forms a 2DEG active region indicated by the dashed line labelled 2DEG in the GaN layer. An overlying passivation layer 120 is patterned with openings to the source region, drain region and gate region of the GaN HEMT. A first conductive metal layer defines a source electrode 112 and a drain electrode 114. For enhancement mode (E-mode) operation, a p-GaN mesa 116 is provided on the gate region underlying metal layers defining the gate electrode 118. This schematic cross-sectional also indicates some parameters of the GaN HEMT, i.e. pitch, source-gate length Lsg, gate length Lg, gate-drain length Lgd. Also indicated are resistances: Rc (channel resistance), Rsg (source gate resistance), Rg (gate resistance), and Rgd (gate-drain resistance).

Figure 2:
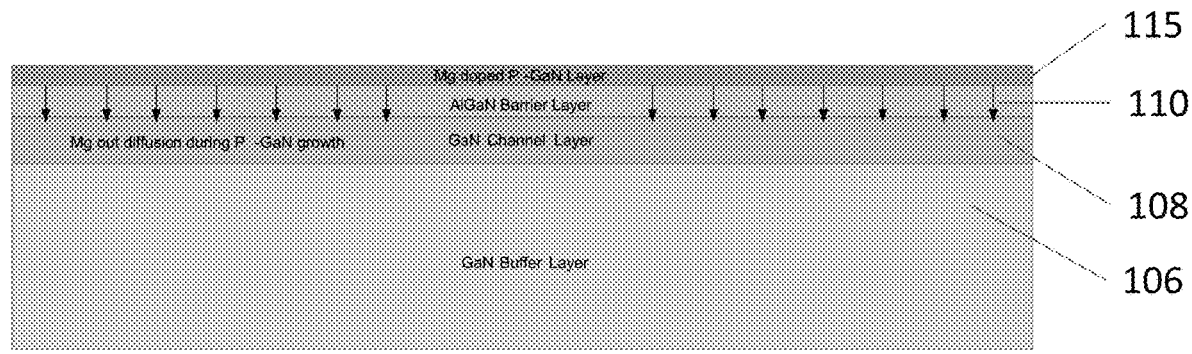
FIG. 2 (Prior Art) shows a schematic cross-sectional view of part of an E-mode GaN HEMT device structure showing blanket deposition of a p-doped GaN layer (p-GaN), which is then etched for conventional gate formation.
Figure 3:
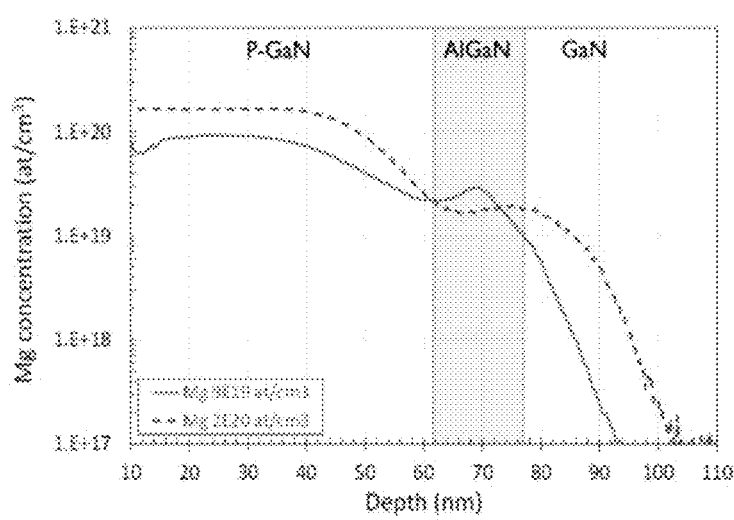
FIG. 3 (Prior Art) shows a graph of p-dopant (Mg) concentration as a function of depth to illustrate the effect of out-diffusion of Mg from the p-GaN of the gate.

To fabricate the structure shown in FIG. 1, as illustrated schematically in FIG. 2 (Prior Art), in a conventional process flow for formation of the GaN HEMT, the epitaxial layer stack comprising the buffer layer 106, GaN channel layer 108 and AlGaN barrier layer 110 is provided by epitaxial growth of the layers, e.g. by MOCVD at elevated temperature, e.g. in a range from 1000 C to 1100 C, and then a blanket layer 115 of p-doped GaN, e.g. Mg doped p-GaN, is deposited over the AlGaN barrier layer 110. The blanket p-GaN layer 115 is typically deposited by a high temperature process, e.g. in the range from 950 C to 1020 C. After blanket growth of the p-doped GaN layer 115, it is patterned to define the p-GaN mesa in the gate region, i.e. the gate region is masked, and the exposed areas of the p-doped GaN layer are removed by etching, leaving the p-GaN mesa 116 in the gate region only, as shown in FIG. 1. As mentioned above, a problem with this process flow, using high temperature MOCVD, is that the p-dopant, e.g. Mg, will out-diffuse during growth of the p-GaN layer, migrating into the AlGaN barrier layer and underlying GaN layer. For example, FIG. 3 (Prior Art) shows a graph of p-dopant (Mg) concentration as a function of depth to illustrate out-diffusion of Mg from the p-GaN of the gate (N. E. Posthuma et al, "Impact of Mg out-diffusion and activation on the p-GaN gate HEMT device performance"). For example, out-diffusion of p-dopant, e.g. Mg, can be detected by methods such as SIMS (Secondary Ion Mass Spectroscopy) or PL (photoluminescence).

Figure 4:
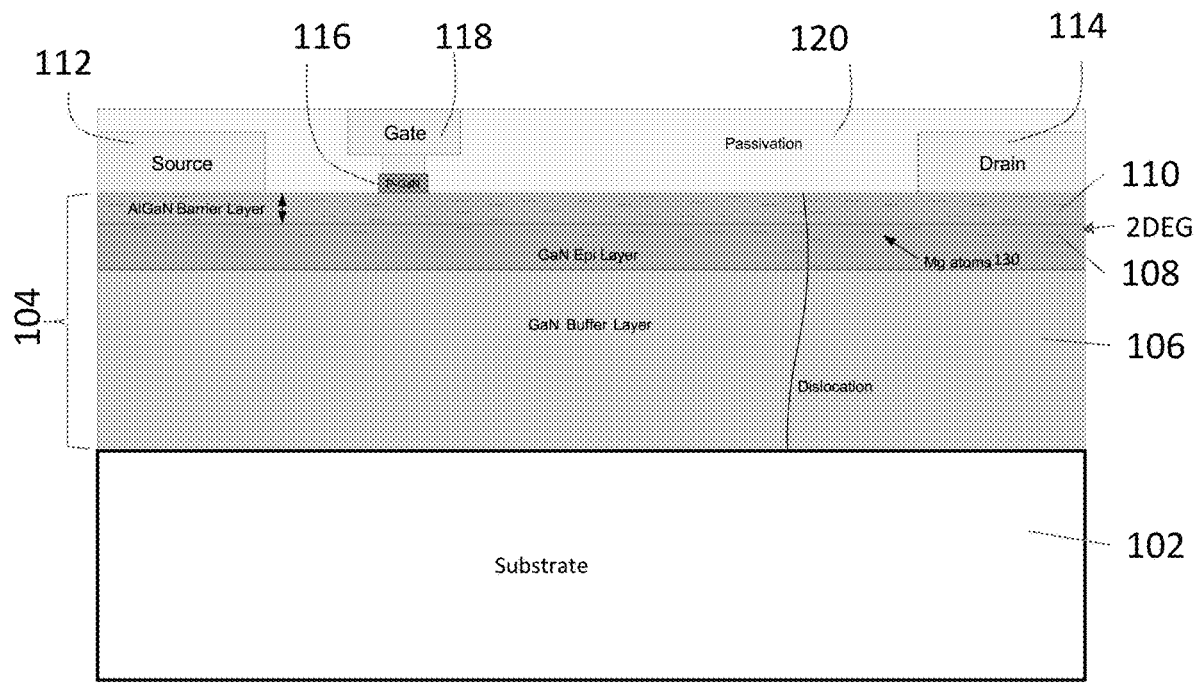
FIG. 4 (Prior Art) shows a schematic cross-sectional view of a conventional E-mode GaN HEMT device structure formed by conventional processes to illustrate out-diffusion of p-dopant into the 2DEG active region.
Figure 5:
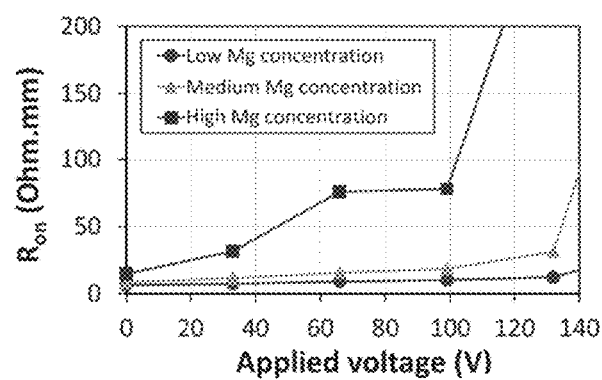
FIG. 5 (Prior Art) shows a graph of Ron vs. applied voltage for different p-dopant concentrations.

P-type dopants present in the channel region will act as acceptors and compensate or reduce the density of the 2DEG channel charge. This is illustrated schematically in FIG. 4, which shows a schematic cross-sectional view of a conventional E-mode GaN HEMT formed by conventional processes to illustrate out-diffusion p-dopant, e.g. Mg, (indicated by dashed lines) into the 2DEG active region. This out-diffusion of p-dopant results in 2DEG compensation, which results in an increase in on-resistance Ron and dynamic on-resistance Rdson. Any defects in the active area of the device, for example dislocations, will tend to enhance diffusion and penetration of the p-dopant into underlying layers. For example, FIG. 5 (Prior Art) shows a graph of Ron vs. applied voltage for different p-dopant concentrations (Posthuma et al.). Etching to remove p-GaN from the AlGaN barrier layer over the access region, e.g. Lgd, and Lgs, may cause etch damage, i.e. create other defects, that also tend to reduce the 2DEG channel charge and increase Rdson.

Figure 6A:
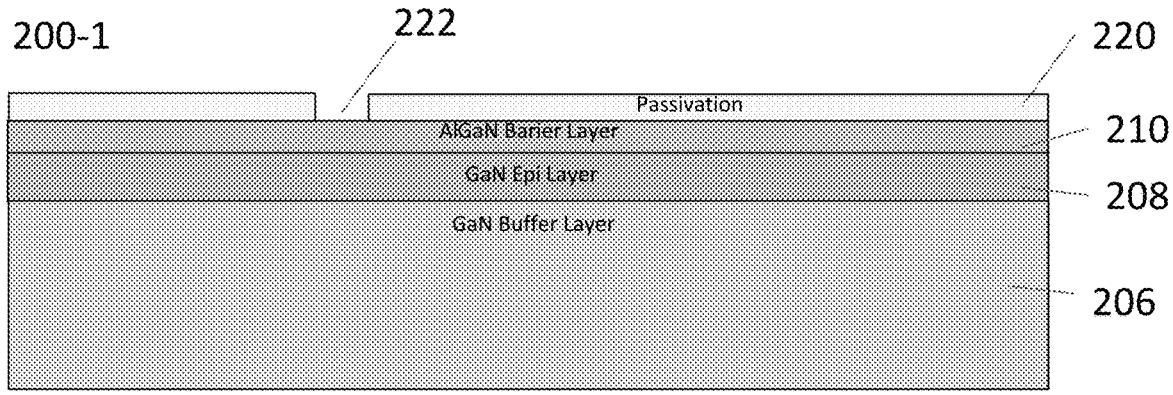
FIGS. 6A, 6B and 6C show schematic cross-sectional views of some steps in the method of fabrication of an E-mode GaN HEMT device structure of a first embodiment.
Figure 6B:
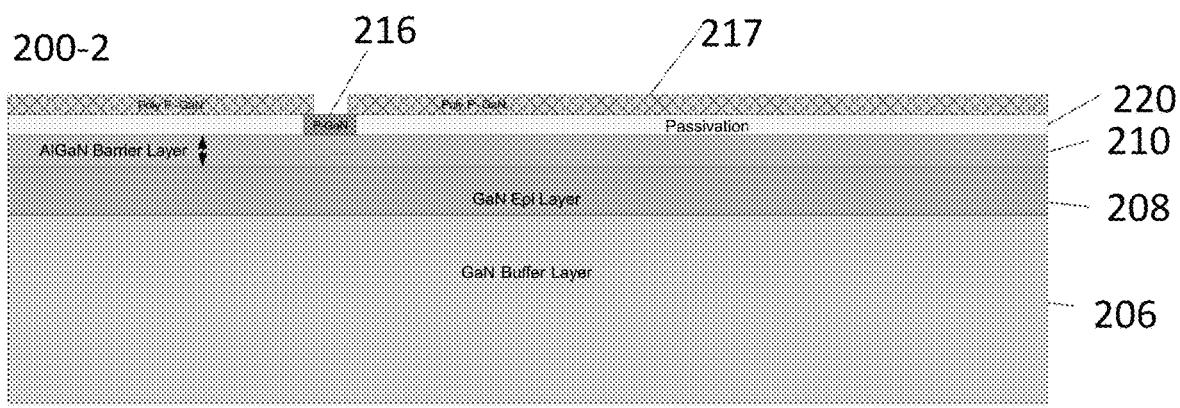
Figure 6C:
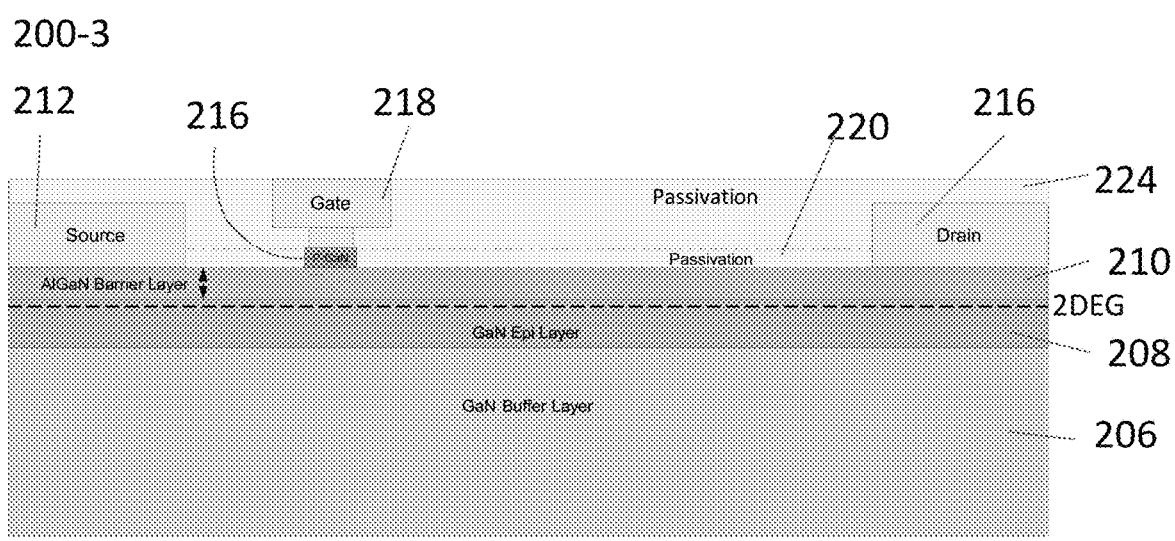

FIGS. 6A, 6B and 6C show schematic cross-sectional views 200-1, 200-2 and 200-3 representing some steps in the method of fabrication of an E-mode GaN HEMT 200, according to a first embodiment, comprising selective gate deposition. This process flow reduces out-diffusion of p-dopant from the p-GaN layer into the underlying layers, to improve device performance. FIG. 6A shows part of the GaN epi-layer stack structure formed on a substrate such as a silicon substrate (not shown) comprising one or more GaN buffer layers 206, and a GaN heterostructure comprising a GaN channel layer 208 and an AlGaN barrier layer 210 forming a 2DEG channel region. As shown in FIG. 6A, after epitaxial growth of the GaN/AlGaN layers of the GaN heterostructure forming the 2DEG channel, a masking layer 220, such as a passivation layer of oxide or nitride is deposited. The masking layer 220 is patterned to define an opening, e.g. a slot 222 in the gate region, exposing the underlying AlGaN barrier layer 210. The gate slot opening 222 is cleaned, and p-GaN 216 is selectively provided in the gate region. A selective growth technique such as MBE, CBE or MOCVD is used to growth the p-GaN gate layer. This step may be achieved by selective growth of p-GaN 216 selectively within the gate slot 222, or growth of a blanket layer of p-GaN over the masking layer 220, as illustrated schematically in FIG. 6B. The latter process will result in formation of p-GaN 216 in the opening and polycrystalline p-GaN 217 extending over the dielectric passivation layer. The unwanted polycrystalline p-GaN 217 is then removed by etching, leaving a p-GaN mesa 216 in the gate region, surrounded by the dielectric masking layer. Patterning the masking layer to expose a gate region of the $Al_xGa_{1-x}N$ barrier layer preferably comprises etching a gate opening shape that facilitates selective area growth of p-GaN within the opening and which reduces any space/gap between the p-GaN gate mesa and the dielectric masking material within the gate opening. This space/gap is due to crystallographic growth and can be minimized by carefully controlled growth conditions and gate opening shape. The material of the masking layer is one or more layers of a material which forms a passivation layer on the AlGaN barrier layer, and the thickness and composition of the passivation layer is also selected to act as a diffusion barrier to the p-dopant in the p-GaN, for example, the passivation layer may be at least one of an oxide dielectric layer and a nitride dielectric layer, e.g. one or more of silicon dioxide, silicon nitride, and other oxides or nitrides that that provide a p-dopant diffusion barrier for Mg or other p-dopants of the p-GaN layer.

After growth of the p-GaN mesa, if required, the masking layer 220 could then be removed. However, as illustrated in FIG. 6B, where the masking layer is a dielectric passivation layer, it is beneficial to leave it in place as part of overlying passivation layers, e.g. so that the masking layer of dielectric passivation protects the underlying layers of the epitaxial layer stack, and to avoid etch damage which may occur from removing masking layer 220 from the surface of the AlGaN barrier layer. Subsequent BEOL (back-end of the line) processing then proceeds as conventionally, i.e. providing a thicker passivation layer, defining openings through the thicker passivation layer to the source, drain and gate regions. One or more layers of conductive metal are then deposited to form the source and drain electrodes and to form the gate electrode, e.g. as illustrated schematically in FIG. 6C This process flow for formation of the p-GaN gate mesa limits out-diffusion of the p-dopant to the gate region, while the dielectric passivation layer acts as a diffusion barrier and blocks diffusion of p-dopant into the access region during growth of p-GaN. Beneficially, the p-GaN layer is deposited by a lower temperature process, e.g. below 950 C, to further limit thermal diffusion of the p-dopant during growth of the p-GaN. P-GaN growth at reduced temperatures, together with the presence of the dielectric passivation layer, which forms a diffusion barrier outside of the gate region, prevents diffusion of the Mg doping from the p-GaN growth and reduces or eliminates resulting contamination of the underlying AlGaN barrier layer in the gate region and the GaN channel layer in the device access regions.

The fabrication process flow is somewhat more complicated than a conventional single epitaxial growth process, because it adds a second epitaxial growth for the selective growth of p-GaN after depositing and patterning the dielectric masking layer. However, if a second chamber is a dedicated growth chamber for the p-GaN layer, it removes the risk of subsequent growth contamination with p-dopant due to memory effects that can occur in a single chamber deposition process. Selective area growth requires a mask, e.g. a dielectric masking layer of oxide or nitride, that has a region where the gate is to be formed removed using photolithography and etch techniques. Once the dielectric mask is etched, the p-GaN gate is formed selectively in the gate region, and only contacts the underlying AlGaN HEMT structure in the opening where the gate is to be located. With this technique there is no need to etch a blanket p-GaN layer and stop on the AlGaN barrier layer surface, thereby avoiding potential etching damage in the device access region, which may negatively impact the underlying 2DEG channel.

Figure 7:
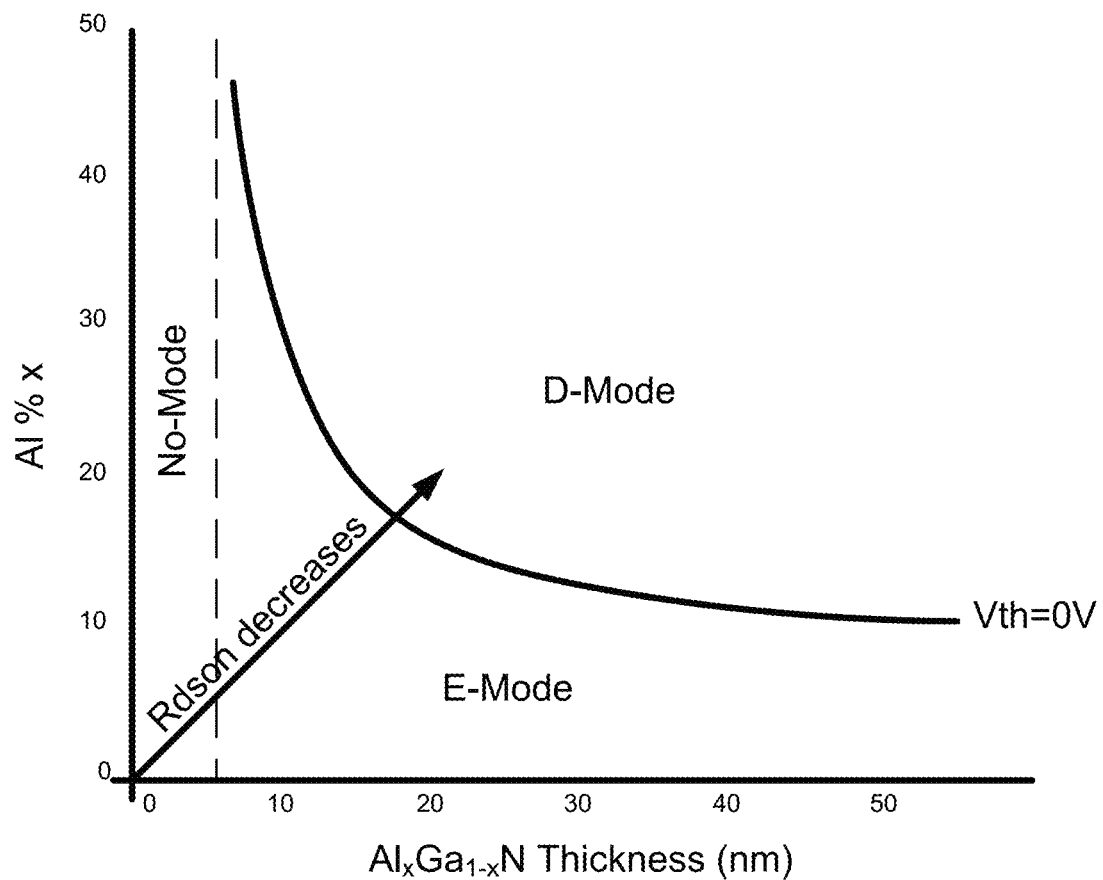
FIG. 7 shows a graph representing the effect of $Al_xGa_{1-x}N$ Thickness and Al % on Rdson.

It is known that increasing the aluminium content of the $Al_xGa_{1-x}N$ barrier layer and increasing the thickness of the barrier layer will reduce Rdson. However, increasing the Al % also tends to reduce the threshold voltage Vth towards zero, causing depletion mode (D-mode) operation. For example, FIG. 7 shows a graph representing the effect of $Al_xGa_{1-x}N$ Thickness and Al % on Rdson and threshold voltage Vth. To obtain reliable E-mode operation, e.g. with a specified threshold voltage in the appropriate range, e.g. 1.3 to 1.6V or more, the $Al_xGa_{1-x}N$ barrier layer is deposited with an appropriate Al %, e.g. in the range from about 15% to 20% Al, and an appropriate thickness, e.g. about 15 nm to 20 nm.

Figure 8A:
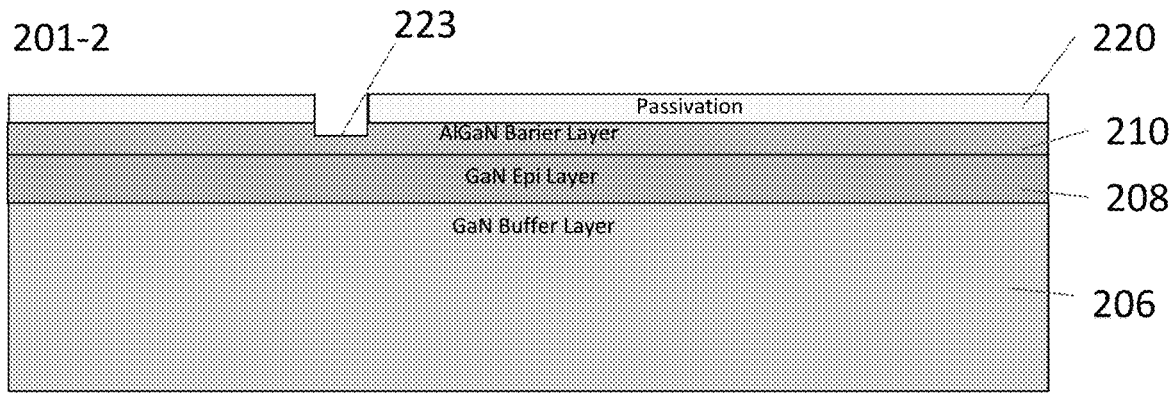
FIGS. 8A, 8B and 8C show schematic cross-sectional views of some steps in the method of fabrication of an E-mode GaN HEMT device structure of a second embodiment.
Figure 8B:
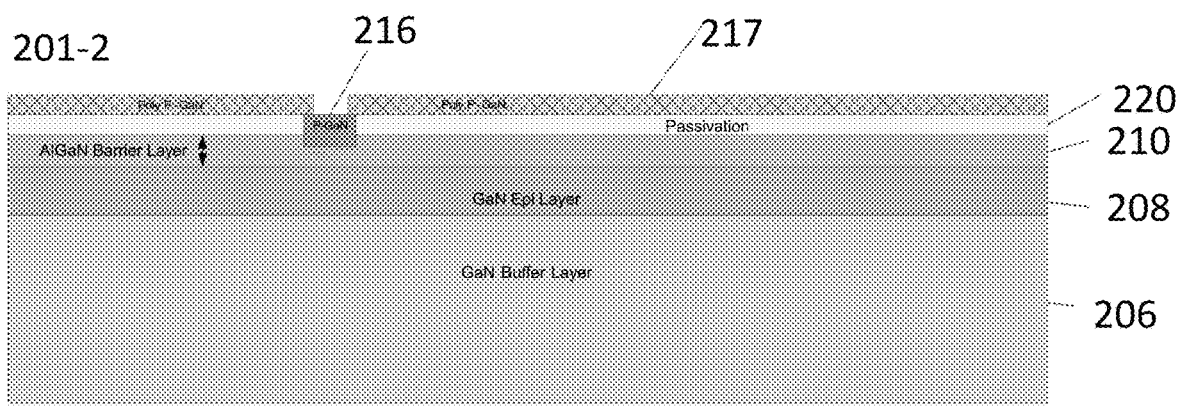
Figure 8C:
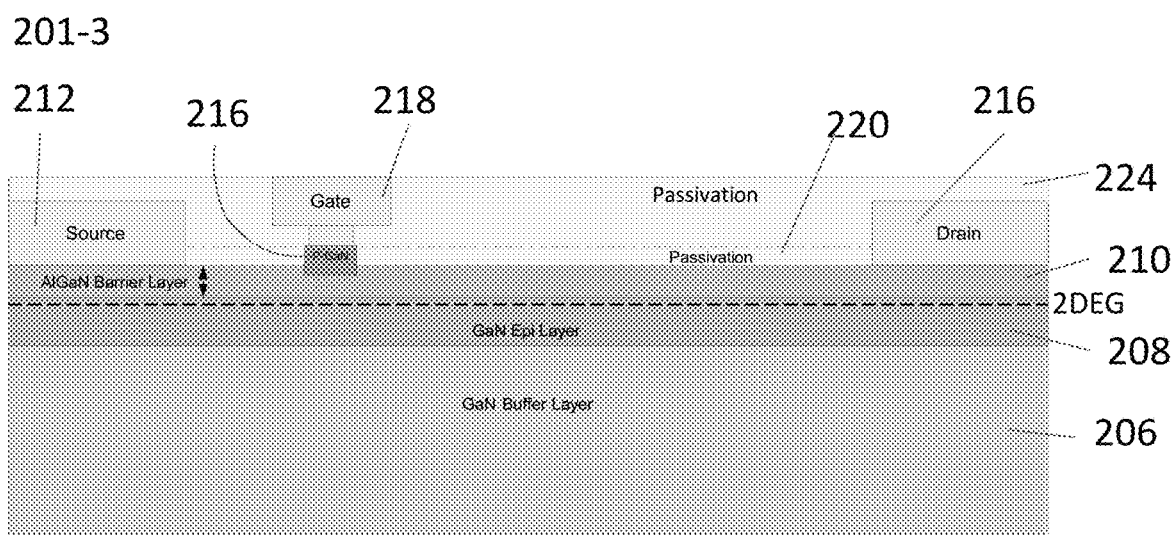

FIGS. 8A, 8B and 8C show schematic cross-sectional views 201-1, 201-2 and 201-3 representing some steps in the method of fabrication of an E-mode GaN HEMT 201 according to a second embodiment, comprising selective gate deposition. Most steps of this process flow are similar to those of the first embodiment, and corresponding elements of the structure are labelled with the same reference numerals. This process flow differs in that, after etching the gate opening 222 in the passivation layer 220, as shown schematically in FIG. 6A, a digital etch is then performed to precisely etch the underlying $Al_xGa_{1-x}N$ barrier layer to reduce its thickness in the gate region 223 relative to the thickness in the neighbouring regions as illustrated schematically in FIG. 8A, before growth of the p-GaN layer in the gate region 216, i.e. as illustrated schematically in FIG. 8B. Thus, as illustrated schematically in FIG. 8C, in the resulting GaN HEMT structure, the $Al_xGa_{1-x}N$ barrier layer has a first thickness in the gate region and a second thickness in the access regions between the gate and the source and the gate and the drain. Referring to FIG. 7, the Al % of the $Al_xGa_{1-x}N$ barrier layer and the thickness of the $Al_xGa_{1-x}N$ barrier layer in the access regions are selected in a range that provides a specified Ron and Rdson of the GaN HEMT. In the gate region, the thickness of the $Al_xGa_{1-x}N$ barrier layer in the gate region is made thinner to provide a specified threshold voltage, i.e. to increase the threshold voltage relative to a thicker $Al_xGa_{1-x}N$ barrier layer of the same Al %.

Figure 9:
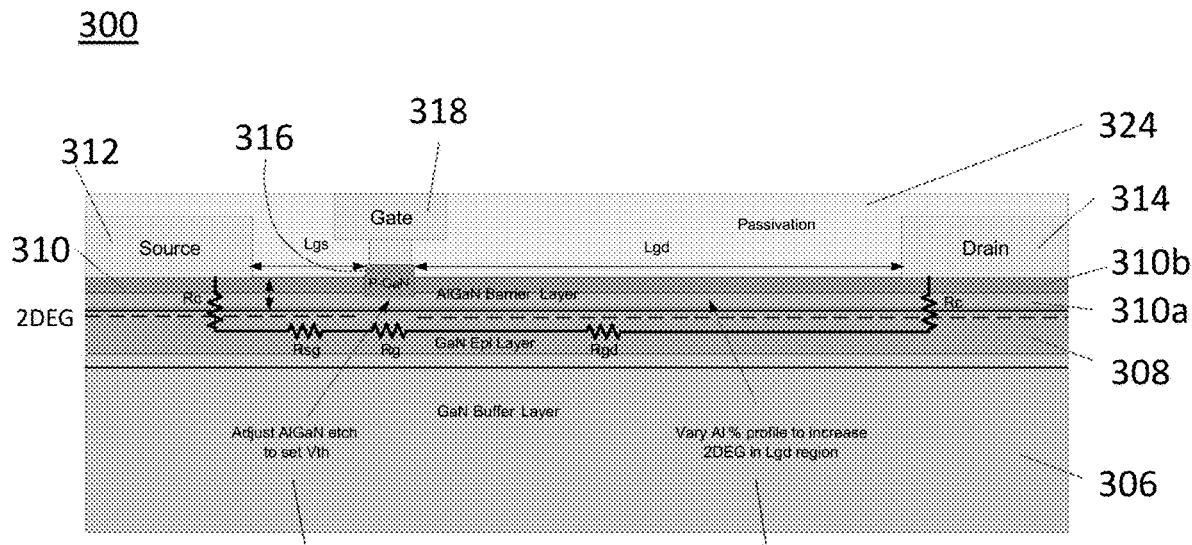
FIG. 9 shows a schematic cross-sectional view of an E-mode GaN HEMT device structure of a third embodiment.

FIG. 9 shows a schematic cross-sectional view of part of an E-mode GaN HEMT device structure 300 of a third embodiment. The device structure comprises: a substrate (not shown); an epitaxial layer stack grown on the substrate, the epitaxial layer comprising a buffer layer 306 and a GaN heterostructure comprising a GaN layer 308 and an overlying $Al_xGa_{1-x}N$ barrier layer 310 to form a 2DEG channel region; a mesa 316 of p-doped GaN on the gate region; source electrode 312 and drain electrode 314 formed on source and drain regions and a gate electrode 318 formed on the p-doped GaN mesa 316 on the gate region. The structure differs from the device structure of the first embodiment shown in FIG. 6C in that the $Al_xGa_{1-x}N$ barrier layer 310 comprises a first thickness 310a having a first Al %, and a second thickness 310b having a second Al %, greater than the first Al %. The second thickness 310b of the $Al_xGa_{1-x}N$ barrier layer is removed from the gate region so that the p-doped GaN mesa 316 and the metal of the gate electrode 318 are provided only on the first thickness 310a of the $Al_xGa_{1-x}N$ barrier layer. The Al % and thickness of the first thickness of $Al_xGa_{1-x}N$ barrier layer is selected to provide an appropriate threshold voltage Vth for E-mode operation. In the access regions, i.e. regions between the source and the gate and the drain and the gate, the additional second thickness 310b of the $Al_xGa_{1-x}N$ barrier layer, that has a higher Al %, provides increased 2DEG channel charge, reducing the Rsg and Rgd, thereby reducing Ron and dynamic Rdson of the GaN HEMT. Thus, the threshold voltage is determined by the Al % under gate, and the resistance Rsg and Rgd determined by the Al % in the access regions, so that the threshold voltage Vth is decoupled from sheet resistance in access regions.

Beneficially, the first Al % of the first thickness of the $Al_xGa_{1-x}N$ barrier layer is selected in a range to provide a specified threshold voltage Vth for reliable E-mode operation, e.g. 1.3V to 1.6V or more, and the second Al % of the second thickness of the $Al_xGa_{1-x}N$ barrier layer to provide a specified Rdson and dynamic Rdson of the GaN HEMT. For example, the first thickness of the $Al_xGa_{1-x}N$ barrier layer may be 15 nm to 20 nm thick and contain a 15% to 18% Al to set the channel Vth, and the second the second thickness of the $Al_xGa_{1-x}N$ barrier layer may be 5 nm to 10 nm thick and contain 20% to 25% Al.

Figure 10:
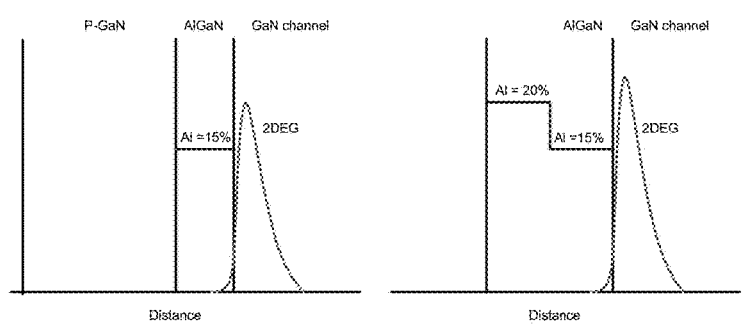
FIG. 10 shows schematic diagrams of the Al % profile in A) the gate region and B) the access region Lgd between the gate and the drain for the GaN HEMT device structure shown in FIG. 9.

By way of example, FIG. 10 shows schematic diagrams of the Al % profile in A) the gate region and B) the access region Lgd between the gate and the drain for the GaN HEMT shown in FIG. 9, for the $Al_xGa_{1-x}N$ barrier layer having the Al % profile described in the preceding paragraph.

The GaN HEMT device structure illustrated schematically in FIG. 9 provides for decoupling of the threshold voltage Vth of the GaN HEMT and the Rdson and dynamic Rdson. In the device structure of the first embodiment, with a conventionally structured AlGaN barrier layer, these parameters are intrinsically linked. By appropriately engineering the thickness and Al % profile of the $Al_xGa_{1-x}N$ barrier layer, the threshold voltage Vth and the Rdson and dynamic Rdson can be more independently controlled to enhance device performance, e.g. to provide a GaN HEMT device structure with a smaller input FOM, that should be superior to conventionally structured GaN HEMTs.

FIGS. 11A, 11B, 11C and 11D show schematic cross-sectional views of some steps in the method of fabrication of the E-mode GaN HEMT device structure 300 of the third embodiment. Selective area p-GaN gate formation allows for the decoupling of the 2DEG channel concentration and the device threshold voltage. To accomplish this known MOCVD growth techniques are used to grow a nucleation layer and one or more buffer layers 306 as well as the GaN channel layer 308. This is followed by an AlGaN barrier layer 310 comprising first and second thicknesses 310a and 310b with variable Al composition, i.e. an Al % profile that varies with thickness, all illustrated schematically in FIG. 11A. For example, the first $Al_xGa_{1-x}N$ thickness 310a, adjacent to the GaN channel layer 308, is formed with a first Al % that is between 15% and 18% and a thickness ranging from 15 nm to 20 nm to set the channel threshold voltage. The second $Al_xGa_{1-x}N$ thickness 310b has a second Al % that ranges from 20% to 25% with a thickness of 5 nm to 10 nm. This second $Al_xGa_{1-x}N$ thickness is used to independently increase the channel 2DEG outside of the gate region. A dielectric passivation layer 320 is then deposited to provide a masking layer and p-dopant diffusion barrier. An opening 322 in the passivation layer 320 is made for the gate. Dielectric passivation layer 322 has a thickness and composition that acts as a p-dopant diffusion barrier, e.g. one or more layers of a material or materials that are selected to provide a diffusion barrier to impede the out-diffusion of p-type dopant into the AlGaN barrier layer and GaN channel layer during the subsequent p-GaN growth, to reduce the deleterious effects of dopant migration on Rdson and dynamic Rdson. A digital etch is used to remove precisely the second AlGaN thickness 310b and expose the surface of the underlying first AlGaN thickness 310a, and if required, to continue etching further into the first AlGaN thickness to an appropriate depth to leave a remaining part 310c of the first AlGaN thickness 310a, as illustrated schematically in FIG. 11B, which sets the threshold voltage Vth. As described above, a selective growth technique such as MBE, CBE or MOCVD is used to grow the p-GaN gate material, preferably a low temperature process at a temperature below 950 C, followed by suitable etching process to remove any unwanted portions of the p-GaN layer, as illustrated schematically in FIG. 11C. As is conventional, BEOL dielectric and conductive metal layers are then deposited, by any suitable known methods, to define the source, gate and drain electrodes to form a GaN E-HEMT device structure, as illustrated schematically in FIG. 11D.

The fabrication process flow for growth of the epitaxial layer stack is somewhat more complicated than a conventional single chamber growth process, because it requires a second epitaxial growth for the p-GaN layer after patterning the masking layer. But, as noted above, if a second chamber is a dedicated growth chamber for the p-GaN layer, it removes the risk of subsequent growth contamination with p-dopant due to memory effects. This process also requires a well-controlled, e.g. digital, etch to precisely remove the top part, i.e. at least the second thickness of the $Al_xGa_{1-x}N$ barrier layer and expose the underlying first thickness of the $Al_xGa_{1-x}N$ barrier layer before forming the p-GaN layer and gate electrode. However, the process provides for engineering the structure and Al % profile of the $Al_xGa_{1-x}N$ barrier layer, to provide for more independent control of the threshold voltage Vth and the Rdson and dynamic Rdson for enhanced device performance.

Figure 11A:
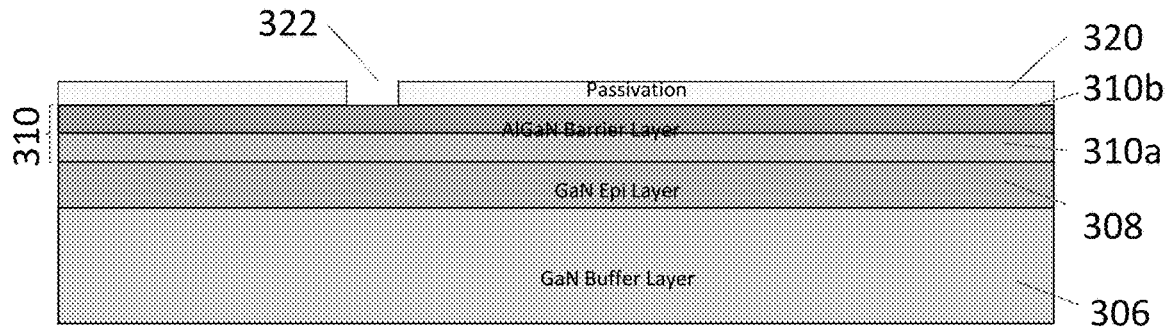
FIGS. 11A, 11B, 11C and 11D show schematic cross-sectional views of some steps in the method of fabrication of an E-mode GaN HEMT device structure of the third embodiment.
Figure 11B:
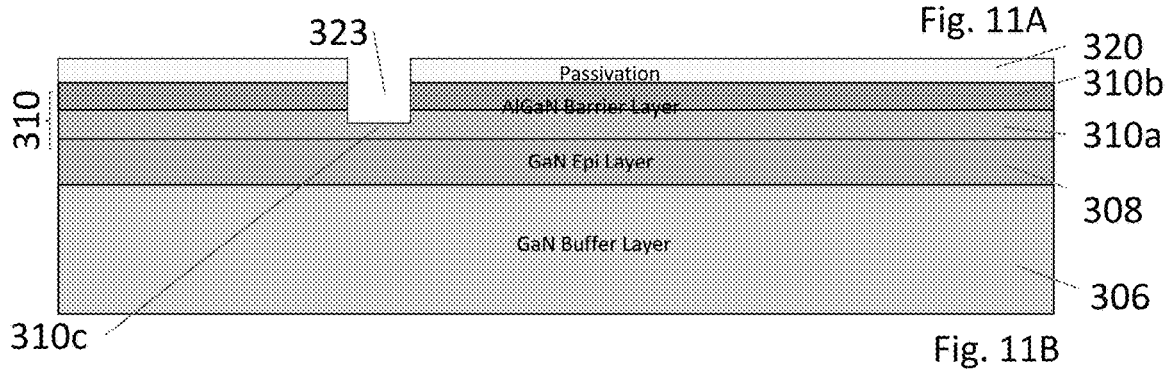
Figure 11C:
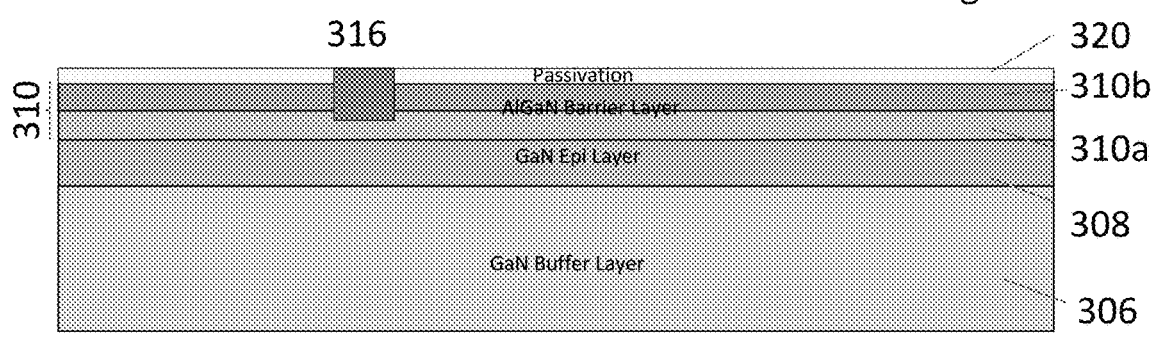
Figure 11D:
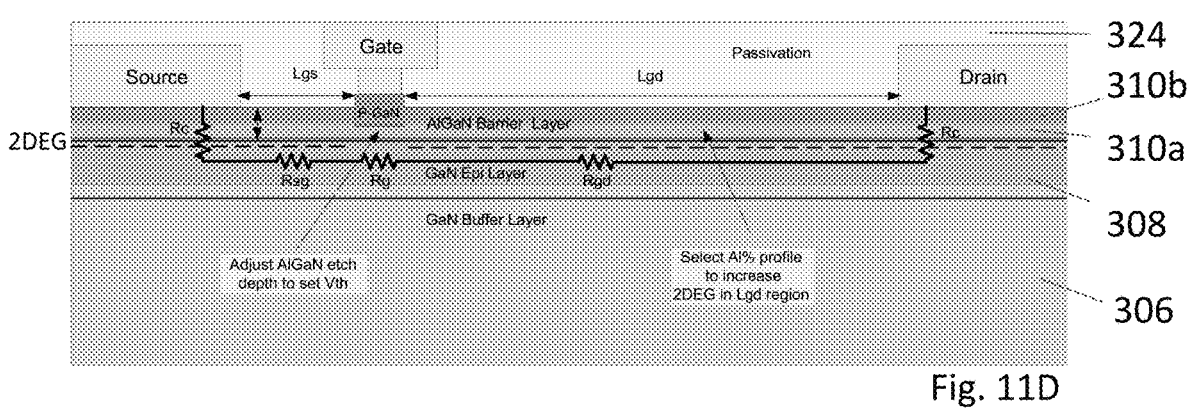

It will be appreciated that the two-step Al % profile of first and second thicknesses of the $Al_xGa_{1-x}N$ barrier layer having different Al %, as shown schematically in FIG. 11D is provided by way of example only. If required, a different or more complex Al % profile of the $Al_xGa_{1-x}N$ barrier layer may be provided to tune Vth, Rdson and dynamic Rdson for specific GaN HEMT device specifications and requirements. For example, the $Al_xGa_{1-x}N$ barrier layer may comprise more than two thicknesses of different Al %, to provide a multi-stepped profile, or the $Al_xGa_{1-x}N$ barrier layer may be provided with a Al % profile in which the Al % is graded, e.g. increased or otherwise varied, as it is deposited to provide a smoother Al % profile that varies with thickness.

Embodiments have been described which are specific to GaN/AlGaN heterostructures for GaN HEMTs comprising a GaN channel layer and an AlGaN barrier layer, in which the p-dopant of the p-GaN of the gate structure is e.g., Mg, and in which the thickness and Al % profile of the $Al_xGa_{1-x}N$ barrier layer is structured for controlling Vth independently, or at least more independently, of Rdson.

It will be appreciated that these methods and device structures are applicable to HEMT devices more generally comprising III-Nitride semiconductors of other compositions, wherein the epitaxial layer structure comprises a III-nitride channel layer and a III-nitride barrier layer, with Mg or other p-dopants for the p-doped III-nitride of the gate structure, and wherein the thickness and composition of the III-nitride barrier layer is selected as described herein, for more independent control of the threshold voltage and Rdson of the HEMT device.

Although embodiments of the invention have been described and illustrated in detail, it is to be clearly understood that the same is by way of illustration and example only and not to be taken by way of limitation, the scope of the present invention being limited only by the appended claims.

The invention claimed is:

1. A GaN HEMT device structure, comprising:
    a substrate;
    an epitaxial layer stack grown on the substrate, the epitaxial layer stack comprising a buffer layer and a GaN heterostructure comprising a GaN layer and an overlying $Al_xGa_{1-x}N$ barrier layer to form a 2DEG channel region;
    a passivation layer formed on the $Al_xGa_{1-x}N$ barrier layer, a gate slot defined in a gate region, the gate slot extending through the passivation layer into the $Al_xGa_{1-x}N$ barrier layer, the gate slot having steep sidewalls and a bottom of the gate slot being a surface defined by a first thickness of the $Al_xGa_{1-x}N$ barrier layer within the gate slot;
    source and drain openings through the passivation layer defined on source and drain regions of the $Al_xGa_{1-x}N$ barrier layer;
    a p-doped GaN mesa on said surface of the first thickness of the $Al_xGa_{1-x}N$ barrier layer within the gate slot;
    source and drain electrodes formed on the source and drain regions;
    a gate electrode formed on the p-doped GaN mesa;
    wherein the $Al_xGa_{1-x}N$ barrier layer comprises said first thickness in the gate region underlying the p-GaN mesa in the gate slot, and a second thickness, greater than the first thickness, in access regions extending between the gate region and the source region and between the gate region and the drain region; and
    the composition of the $Al_xGa_{1-x}N$ barrier layer having an Al % in a range wherein the first thickness provides a specified threshold voltage and the second thickness provides a specified Rdson of the GaN HEMT device structure.

2. The GaN HEMT device structure of claim 1, wherein the passivation layer comprises at least a first layer of a dielectric material that forms a p-dopant diffusion barrier.

3. The GaN HEMT device structure of claim 2, wherein said first layer of the dielectric material comprises at least one of a layer of dielectric oxide and a layer of a dielectric nitride.

4. The GaN HEMT device structure of claim 3, wherein the p-dopant is magnesium (Mg) and said first layer of dielectric material is a Mg diffusion barrier.

5. The GaN HEMT device structure of claim 4, wherein an out-diffused p-dopant content in the access regions of the $Al_xGa_{1-x}N$ barrier layer is less than an out-diffused p-dopant content in the gate region of the $Al_xGa_{1-x}N$ barrier layer.

6. A method of fabrication of a GaN HEMT device structure as defined in claim 1 comprising:
    providing a substrate;
    growing an epitaxial layer stack on the substrate, the epitaxial layer stack comprising a buffer layer and a GaN heterostructure comprising a GaN channel layer and an overlying $Al_xGa_{1-x}N$ barrier layer to form a 2DEG channel region;
    providing a passivation layer over the epitaxial layer stack and selectively removing the passivation layer from a gate region to define a gate slot exposing a surface of the $Al_xGa_{1-x}N$ barrier layer;
    digitally etching said surface of the $Al_xGa_{1-x}N$ barrier layer to thin the $Al_xGa_{1-x}N$ barrier layer within the gate slot to provide a gate slot having steep sidewalls and a surface of a first thickness of the $Al_xGa_{1-x}N$ barrier layer at a bottom of the gate slot; and
    selectively providing p-GaN on said surface of the first thickness of the $Al_xGa_{1-x}N$ barrier layer by selective area growth to form a p-GaN mesa within the gate slot; and
    defining openings through the passivation layer to source and drain regions and providing source and drain electrodes thereon, and providing a gate electrode on the p-GaN mesa.

7. The method of claim 6, wherein the dielectric passivation layer has a thickness and composition that forms a p-dopant diffusion barrier.

8. The method of claim 7, wherein selective area growth of p-GaN comprises a low temperature growth process at a temperature below 950 C.

9. The GaN HEMT device structure of claim 7, wherein an out-diffused p-dopant content in access regions of the $Al_xGa_{1-x}N$ barrier layer, said access regions extending between the gate region and the source region and between the gate region and the drain region, is less than an out-diffused p-dopant content in the gate region of the $Al_xGa_{1-x}N$ barrier layer.

10. The method of claim 6, wherein selective area growth of p-GaN comprises a low temperature growth process at a temperature below 950 C, which forms p-GaN on said surface of the $Al_xGa_{1-x}N$ barrier layer within the gate slot and forms polycrystalline p-GaN extending over the passivation layer, the polycrystalline p-GaN extending over the masking layer then being removed, leaving the p-GaN mesa within the gate slot.

11. The method of claim 10, wherein the passivation layer comprises at least one of a layer of a dielectric oxide and a layer of a dielectric nitride, having a thickness and composition that forms a p-dopant diffusion barrier.

12. The method of claim 6, further comprising a step of cleaning said surface of the $Al_xGa_{1-x}N$ barrier layer in the gate slot before selective area growth of p-GaN in the gate slot.

13. The GaN HEMT device structure of claim 1, wherein the composition of the $Al_xGa_{1-x}N$ barrier layer has an Al % in a range of 15% to 25%.

14. A GaN HEMT device structure comprising:
    a substrate;
    an epitaxial layer stack grown on the substrate, the epitaxial layer stack comprising a buffer layer and a GaN heterostructure comprising a GaN layer and an overlying $Al_xGa_{1-x}N$ barrier layer to form a 2DEG channel region, wherein the $Al_xGa_{1-x}N$ barrier layer comprise a first thickness having a first Al %, and a second thickness having a second Al %, greater than the first Al %;
a passivation layer formed on the $Al_xGa_{1-x}N$ barrier layer having a gate slot defined on a gate region of the $Al_xGa_{1-x}N$ barrier layer, the gate slot extending through the passivation layer into the $Al_xGa_{1-x}N$ barrier layer, the gate slot having steep sidewalls and a bottom of the gate slot being defined by a surface of the first thickness of the $Al_xGa_{1-x}N$ barrier layer;
source and drain openings defined through the passivation layer on source and drain regions of $Al_xGa_{1-x}N$ barrier layer;
a p-doped GaN mesa formed on said surface of the first thickness of the $Al_xGa_{1-x}N$ barrier layer within the gate slot;
source and drain electrodes formed on source and drain regions a gate electrode formed on the p-doped GaN mesa; and
wherein the $Al_xGa_{1-x}N$ barrier layer comprises said first thickness in the gate region underlying the p-GaN mesa in the gate slot and comprises said first and second thicknesses in access regions extending between the gate region and the source region and between the gate region and the drain region.

15. A method of fabrication of the GaN HEMT device structure as defined in claim 14, comprising:
providing a substrate;
growing an epitaxial layer stack on the substrate, the epitaxial layer stack comprising a buffer layer and a GaN heterostructure comprising a GaN channel layer and an overlying $Al_xGa_{1-x}N$ barrier layer to form a 2DEG channel region, wherein the $Al_xGa_{1-x}N$ barrier layer comprises a first thickness having a first Al %, and a second thickness having a second Al %, greater than the first Al %;
providing a passivation layer over the epitaxial layer stack and selectively removing the passivation layer in a gate region to define a gate slot exposing a surface of the $Al_xGa_{1-x}N$ barrier layer;
digitally etching said surface of the $Al_xGa_{1-x}N$ barrier layer to remove the second thickness of the $Al_xGa_{1-x}N$ barrier layer within the gate slot to provide a gate slot having steep sidewalls and a surface of the first thickness of the $Al_xGa_{1-x}N$ barrier layer at a bottom of the gate slot;
selectively providing p-GaN on said surface of the first thickness $Al_xGa_{1-x}N$ barrier layer by selective area growth to form a p-GaN mesa within the gate slot;
defining openings through the passivation layer to source and drain regions and providing source and drain electrodes thereon, and providing a gate electrode on the p-GaN mesa.

16. The method of claim 15, comprising selecting the first Al % and the first thickness of the $Al_xGa_{1-x}N$ barrier layer to provide a specified threshold voltage for E-mode operation, and selecting the second Al % and the second thickness of the $Al_xGa_{1-x}N$ barrier layer to provide a specified Rdson and dynamic Rdson of the GaN HEMT.

17. The method of claim 16, wherein the first Al % is in the range from 15% to 18% and the first thickness of the $Al_xGa_{1-x}N$ barrier layer in the range 15 nm to 20 nm to define a specified threshold voltage for E-mode operation, and the second Al % is in the range from 20% to 25% and the second thickness of the $Al_xGa_{1-x}N$ barrier layer is in the range from 5 nm to 10 nm to provide a specified Rdson and dynamic Rdson of the GaN HEMT.

18. The method of claim 17, wherein the first Al % and the first thickness of the $Al_xGa_{1-x}N$ barrier layer provides a specified threshold voltage for E-mode operation of at least 1.3V.

19. The method of claim 18, where providing the passivation layer comprises providing at least a first layer of a dielectric material of a thickness that forms a p-dopant diffusion barrier, and wherein selectively providing a p-GaN mesa in the gate slot comprises selective area growth of p-GaN within the gate slot, using a low temperature growth process at a temperature below 950 C.

20. The GaN HEMT device structure of claim 14, wherein the passivation layer comprises at least a first layer of a dielectric material of a thickness that forms a p-dopant diffusion barrier.

21. The GaN HEMT device structure of claim 20, wherein said first layer comprises at least one of a layer of dielectric oxide and a layer of a dielectric nitride.

22. The GaN HEMT device structure of claim 21, wherein the p-dopant is magnesium (Mg) and said first layer is a Mg diffusion barrier.

23. The GaN HEMT device structure of claim 14, wherein the first Al % is in the range from 15% to 18% and the first thickness of the $Al_xGa_{1-x}N$ barrier layer is in the range 15 nm to 20 nm to provide a specified threshold voltage for E-mode operation, and the second Al % is in the range from 20% to 25% and the second thickness of the $Al_xGa_{1-x}N$ barrier layer is in the range from 5 nm to 10 nm to provide a specified Rdson and dynamic Rdson of the GaN HEMT.

24. The GaN HEMT device structure of claim 23, wherein the first Al % and the first thickness of the $Al_xGa_{1-x}N$ barrier layer provides a specified threshold voltage for E-mode operation of at least 1.3V.

25. The GaN HEMT device structure of claim 20, wherein the first Al % and the first thickness of the $Al_xGa_{1-x}N$ barrier layer provide a specified threshold voltage for E-mode operation, and the second Al % and the second thickness of the $Al_xGa_{1-x}N$ barrier layer provide a specified Rdson and dynamic Rdson of the GaN HEMT device structure.

* * * * *

UNITED STATES PATENT AND TRADEMARK OFFICE
CERTIFICATE OF CORRECTION

PATENT NO. : 10,985,259 B2
APPLICATION NO. : 16/212755
DATED : April 20, 2021
INVENTOR(S) : Thomas Macelwee Page 1 of 1

It is certified that error appears in the above-identified patent and that said Letters Patent is hereby corrected as shown below:

In the Claims

Column 14, Line 48: "claim 20" should read -- claim 14 --

Signed and Sealed this
Third Day of January, 2023

Katherine Kelly Vidal
*Director of the United States Patent and Trademark Office*